(12) United States Patent
Gotsick

(10) Patent No.: US 10,391,682 B2
(45) Date of Patent: Aug. 27, 2019

(54) APPARATUS FOR THERMAL PROCESSING OF FLEXOGRAPHIC PRINTING ELEMENTS

(71) Applicant: MacDermid Graphics Solutions, LLC, Waterbury, CT (US)

(72) Inventor: Timothy Gotsick, Acworth, GA (US)

(73) Assignee: MacDermid Graphics Solutions LLC, Waterbury, CT (US)

(*) Notice: Subject to any disclaimer, the term of this patent is extended or adjusted under 35 U.S.C. 154(b) by 325 days.

(21) Appl. No.: 15/485,336

(22) Filed: Apr. 12, 2017

(65) Prior Publication Data
US 2017/0217055 A1    Aug. 3, 2017

Related U.S. Application Data

(62) Division of application No. 13/965,537, filed on Aug. 13, 2013, now Pat. No. 9,649,786.

(51) Int. Cl.
| | |
|---|---|
| *B29C 35/08* | (2006.01) |
| *G03F 7/36* | (2006.01) |
| *B41N 1/06* | (2006.01) |
| *B29C 35/02* | (2006.01) |

(52) U.S. Cl.
CPC ............ *B29C 35/0805* (2013.01); *B41N 1/06* (2013.01); *G03F 7/36* (2013.01); *B29C 2035/0283* (2013.01); *B29C 2035/0822* (2013.01); *B29C 2035/0827* (2013.01); *B29C 2035/0833* (2013.01); *B29C 2035/0877* (2013.01)

(58) Field of Classification Search
CPC .................................................. B29C 35/0805
See application file for complete search history.

(56) References Cited

U.S. PATENT DOCUMENTS

| | | | |
|---|---|---|---|
| 3,264,103 | A | 8/1966 | Cohen et al. |
| 3,265,765 | A | 8/1966 | Holden et al. |
| 3,867,153 | A | 2/1975 | MacLachlan |
| 4,264,705 | A | 4/1981 | Allen |
| 4,320,188 | A | 3/1982 | Heinz et al. |
| 4,323,636 | A | 4/1982 | Chen |

(Continued)

FOREIGN PATENT DOCUMENTS

| | | |
|---|---|---|
| EP | 045336 A2 | 11/1991 |
| EP | 0640878 A1 | 3/1995 |

(Continued)

*Primary Examiner* — Larry W Thrower
(74) *Attorney, Agent, or Firm* — Carmody Torrance Sandak & Hennessey

(57) ABSTRACT

An apparatus for thermally processing a relief image printing element and a method of using the same are described. The printing element comprises at least one photopolymer layer and is selectively exposed to actinic radiation to crosslink portions of the at least one photopolymer layer. The apparatus comprises: (a) means for supporting the printing element; (b) heating means for melting or softening non-crosslinked portions of the at least one photopolymer layer; (c) at least one rotatable roll that is capable of bringing a blotting material into contact with the at least one photopolymer layer to remove the melted or softened non-crosslinked portions of the at least one photopolymer layer; and (d) an element arranged adjacent to the at least one rotatable roll for removing non-crosslinked photopolymer remaining on a surface of the at least one rotatable roll after step c). The apparatus may alternatively be operated without a blotting material.

16 Claims, 3 Drawing Sheets

(56) References Cited

U.S. PATENT DOCUMENTS

| | | | |
|---|---|---|---|
| 4,323,637 | A | 4/1982 | Chen et al. |
| 4,369,246 | A | 1/1983 | Chen et al. |
| 4,423,135 | A | 12/1983 | Chen et al. |
| 4,427,759 | A | 1/1984 | Gruetzmacher et al. |
| 4,622,088 | A | 11/1986 | Min |
| 5,135,827 | A | 8/1992 | Bohm et al. |
| 5,175,072 | A | 12/1992 | Martens |
| 5,223,375 | A | 1/1993 | Berrier et al. |
| 5,262,275 | A | 11/1993 | Fan |
| 5,279,697 | A | 1/1994 | Peterson et al. |
| 5,925,500 | A | 7/1999 | Yang et al. |
| 6,215,972 | B1 | 4/2001 | An et al. |
| 6,238,837 | B1 | 5/2001 | Fan |
| 6,773,859 | B2 | 8/2004 | Fan et al. |
| 7,122,295 | B2 | 10/2006 | Mengel et al. |
| 2005/0211120 | A1 | 9/2005 | Markhart |
| 2006/0105268 | A1 | 5/2006 | Vest |
| 2006/0124009 | A1 | 6/2006 | Markhart |
| 2007/0084368 | A1 | 4/2007 | Vest et al. |
| 2010/0119978 | A1 | 5/2010 | Vest |
| 2010/0189916 | A1 | 7/2010 | Watanabe |

FOREIGN PATENT DOCUMENTS

| | | |
|---|---|---|
| EP | 1239329 A2 | 9/2002 |
| GB | 1366769 | 9/1974 |
| JP | 2000-153207 | 6/2000 |
| JP | 2009-511985 | 3/2009 |
| JP | 2011/186311 A | 9/2011 |
| JP | 2013-511745 | 9/2013 |
| WO | 0118604 A2 | 3/2001 |
| WO | 0188615 A1 | 11/2001 |
| WO | 2007/046949 A1 | 4/2007 |
| WO | 2008/018530 | 2/2008 |
| WO | 2011/062687 A1 | 5/2011 |

…

APPARATUS FOR THERMAL PROCESSING OF FLEXOGRAPHIC PRINTING ELEMENTS

FIELD OF THE INVENTION

The present invention relates generally to an apparatus for thermal processing of flexographic printing elements and a method of using the same.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretched films can be economically printed only by means of flexography. Flexographic printing plates are relief plates with image elements raised above open areas. Such plates offer a number of advantages to the printer, based chiefly on their durability and the ease with which they can be made.

A typical flexographic printing blank as delivered by its manufacturer, is a multilayered article made of, in order, a backing or support layer, one or more layers of unexposed (uncured) photopolymer, a protective layer or slip film, and a cover sheet.

The one or more unexposed photopolymer layer(s) can include any of the known photopolymers, monomers, initiators, reactive or non-reactive diluents, fillers, and dyes. The term "photocurable" refers to a solid composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. If a second photocurable layer is used, i.e., an overcoat layer, it typically is disposed upon the first layer and is similar in composition.

The photopolymer materials generally cross-link (cure) and harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm. One suitable source of actinic radiation is a UV lamp, although other sources are generally known to those skilled in the art.

Although photopolymer printing elements are typically used in "flat" sheet form, there are particular applications and advantages to using the printing element in a continuous cylindrical form, as a "continuous in-the-round" (CITR) photopolymer sleeve. CITR sleeves have applications in the printing of continuous designs such as in wallpaper, decoration and gift-wrapping paper. A typical CITR photopolymer sleeve generally comprises a sleeve carrier (support layer) and at least one unexposed photocurable layer on top of the support layer.

A flexographic printing element is produced from a photopolymer printing blank by imaging the photopolymer printing blank to produce a relief image on the surface of the printing element. This is generally accomplished by selectively exposing the photocurable material to actinic radiation, which exposure acts to harden or crosslink the photocurable material in the irradiated areas. The areas that are not exposed to actinic radiation can then be removed in a subsequent step.

The printing element is selectively exposed to actinic radiation in one of several related ways. In a first alternative, a photographic negative with transparent areas and substantially opaque areas is used to selectively block the transmission of actinic radiation to the printing plate element. In a second alternative, the unexposed photopolymer layer is coated with an actinic radiation (substantially) opaque layer that is sensitive to laser ablation. A laser is then used to ablate selected areas of the actinic radiation opaque layer creating an in situ negative. This technique is well-known in the art, and is described for example in U.S. Pat. Nos. 5,262,275 and 6,238,837 to Fan, and in U.S. Pat. No. 5,925,500 to Yang et al., the subject matter of each of which is herein incorporated by reference in their entirety. In a third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Any conventional sources of actinic radiation can be used for the exposure step. Suitable visible or UV sources include carbon arcs, mercury-vapor arcs, fluorescent lamps, electron flash units, electron beam units and photographic flood lamps, by way of example and not limitation.

After imaging, the photosensitive printing element is processed or "developed" to remove uncured (i.e., non-crosslinked) portions of the photopolymer layer, without disturbing the cured portions of the photopolymer layer, to produce the relief image on the surface of the printing element. Typical methods of development include washing with various solvents or water, often with a brush. Other possibilities for development include thermal development or the use of an air knife.

It is highly desirable in the flexographic prepress printing industry to eliminate the need for chemical processing of printing elements in developing relief images, in order to go from plate to press more quickly. Thus, processes have been developed whereby photopolymer printing plates are prepared using heat and the differential melting temperature between cured and uncured photopolymer is used to develop the latent image. The basic parameters of this process are known, as described in U.S. Pat. Nos. 7,122,295, 6,773,859, 5,279,697, 5,175,072 and 3,264,103, in published U.S. patent publication Nos. U.S. 2006/0124009 and, U.S. 2010/0119978, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of the process allow for use of the process in the manufacture of flexographic plates for printing newspapers and other publications where quick turnaround times and high productivity are important.

The composition of the photopolymer is such that there exists a substantial difference in the behavior of the cured and uncured polymer when subjected to heat. It is precisely this difference that allows the creation of an image in the cured photopolymer when heated. The uncured photopolymer (i.e., the portions of the photopolymer layer not contacted with actinic radiation) melts or substantially softens while the cured photopolymer remains solid and intact at the temperature chosen for thermal processing. Thus the difference in behavior allows the uncured photopolymer to be selectively removed, thereby creating an image.

The printing element is heated to a temperature sufficient to effect melting or softening by conduction, convection or other heating method as is known in the art. For example, the printing element may be heated to a temperature of at least about 70° C., more typically between about 120 to about 200° C. The exact temperature will depend upon the properties of the particular photopolymer being used. However, two primary factors are generally considered in determining the development temperature:

1) The development temperature is preferably set between the melt or softening temperature of the uncured photopolymer on the low end and the melt or softening temperature of the cured photopolymer on the upper end. This will allow selective removal of the photopolymer, thereby creating the image; and
2) The higher the development temperature, the quicker the process time will be. However, the development temperature should not be so high as to degrade the cured photopolymer. The temperature should be sufficient to melt or substantially soften the uncured photopolymer, thereby allowing it to be removed.

Once the printing element has been heated, uncured photopolymer can be melted or removed. The heated printing element is contacted with a material that will absorb or otherwise remove the softened or melted uncured photopolymer. This removal process is generally referred to as "blotting" and is typically accomplished using an absorbent web of material. Either woven or non-woven material can be used and the material can be polymer based or paper, so long as the material is capable of withstanding the operating temperatures involved. Blotting is accomplished using one or more rollers to bring the blotting material and the heated printing plate element into contact.

The uncured photopolymer layer is heated by conduction, convection, or other heating method to a temperature sufficient to effect melting. By maintaining more or less intimate contact of the absorbent sheet material with the photocurable layer, a transfer of the uncured photopolymer from the photopolymer layer to the absorbent sheet material takes place. While still in the heated condition, the absorbent sheet material is separated from the cured photopolymer layer in contact with the support layer to reveal the relief structure. After cooling, the resulting flexographic printing plate can be mounted on a printing plate cylinder.

Upon completion of the development step, the printing plate element is optionally, but preferably, post-exposed to further actinic radiation and/or detacked. The printing element may then be cooled and is ready for use.

A typical apparatus for thermally development (also known as thermal processing) comprises:
 a) Means for supporting the flexographic printing element;
 b) Heating means for softening or melting non-crosslinked photopolymer on the imaged and exposed surface of the flexographic printing element;
 c) At least one roll that is capable of bringing a blotting material into contact with the surface of the flexographic printing element to remove the softened or melted non-crosslinked photopolymer on the surface of the flexographic printing element; and
 d) Means for maintaining contact between the at least one roll and the surface of the flexographic printing element.

U.S. Pat. Pub. No. 2010/0119978 to Vest and U.S. Pat. Pub. No. 2006/0124009 to Markhart, the subject matter of each of which is herein incorporated by reference in its entirety describe thermal development apparatuses in which the printing element is heated to a temperature sufficient to selectively melt or soften the uncured portions of the at least one layer of photopolymer such that the softened or melted uncured photopolymer is removable from the printing element by contacting the heated printing element with a blotting material.

One problem that can arise in thermal processing is that the blotting material may not carry away all of the uncured photopolymer. Various methods have been previously used for preventing buildup of uncured photopolymer material on the surface of the hot roll. For example, the hot roll may be covered with a non-stick coating to prevent uncured photopolymer from adhering to the hot roll, the hot roll may be subjected to periodic reverse cycles of rotation against a stationary blotter, or the hot roll may be manually cleaned by mechanical cleaning (i.e., abrasives), use of a chemical cleaning solution, or both. However, the use of periodic reverse cycles of rotation and manual cleaning of the hot roll both require that the thermal processor be taken off-line for cleaning. Furthermore, if the hot roll is covered with a non-stick coating, the non-stick coating may eventually wear off, especially at the elevated temperatures of the thermal processor, and cease working.

Thus, there remains a need in to the art for an improved thermal development processor that includes an improved means for cleaning the hot roll and that overcomes the deficiencies of the prior art.

SUMMARY OF THE INVENTION

It is an object of the present invention to provide an improved thermal development apparatus.

It is another object of the present invention to provide an improved thermal development apparatus having an improved cleaning mechanism for preventing buildup of uncured photopolymer material on a surface of the hot roll.

It is still another object of the present invention to provide an improved thermal development apparatus that does not require the use of a blotting material.

To that end, in one embodiment, the present invention relates generally to an apparatus for thermally processing a relief image printing element, wherein the relief image printing element comprises at least one photopolymer layer, and wherein the relief image printing element is selectively exposed to actinic radiation to crosslink portions of the at least one photopolymer layer, while portions of the at least one photopolymer layer are not exposed to actinic radiation and are not crosslinked, the apparatus, comprising:
 a) means for supporting the relief image printing element;
 b) heating means for melting or softening non-crosslinked portions of the at least one photopolymer layer;

c) at least one rotatable roll that is capable of bringing a blotting material into contact with the at least one photopolymer layer to remove the melted or softened non-crosslinked portions of the at least one photopolymer layer, wherein a nip is formed between the means for supporting the relief image printing element and the at least one rotatable roll, wherein as the at least one rotatable roll rotates against the relief image printing element, melted or softened non-crosslinked portions of the at least one photopolymer layer are transferred from the relief image printing element to the blotting material;

d) an element arranged adjacent to the at least one rotatable roll for removing non-crosslinked photopolymer remaining on a surface of the at least one rotatable roll after step c).

In another embodiment, the present invention relates generally to an apparatus for thermally processing a relief image printing element, wherein the relief image printing element comprises at least one photopolymer layer, and wherein the relief image printing element is selectively exposed to actinic radiation to crosslink portions of the at least one photopolymer layer, while portions of the at least one photopolymer layer are not exposed to actinic radiation and are not crosslinked, the apparatus comprising:

a) means for supporting the relief image printing element;

b) heating means for melting or softening non-crosslinked portions of the at least one photopolymer layer;

c) at least one rotatable roll arranged adjacent to the means for support of the relief image printing element to remove melted or softened non-crosslinked portions of the at least one photopolymer layer, wherein a nip is formed between the means for supporting the relief image printing element and the at least one rotatable roll, wherein as the at least one rotatable roll rotates against the relief image printing element, melted or softened non-crosslinked portions of the at least one photopolymer layer are transferred from the relief image printing element to a surface of the at least one rotatable roll;

d) a scraping means, arranged adjacent to the at least one rotatable roll at a point after the nip, for scraping the transferred melted or softened non-crosslinked portions of the at least one photopolymer layer from the surface of the at least one rotatable roll; and e) a waste container arranged to contain the non-crosslinked photopolymer scraped from the surface of the at least one rotatable roll.

BRIEF DESCRIPTION OF THE DRAWINGS

For a fuller understanding of the invention, reference is had to the following description taken in connection with the accompanying figures, in which.

Also, while not all elements may be labeled in each figure, all elements with the same reference number indicate similar or identical parts.

DETAILED DESCRIPTION OF THE PREFERRED EMBODIMENTS

Figure 1:
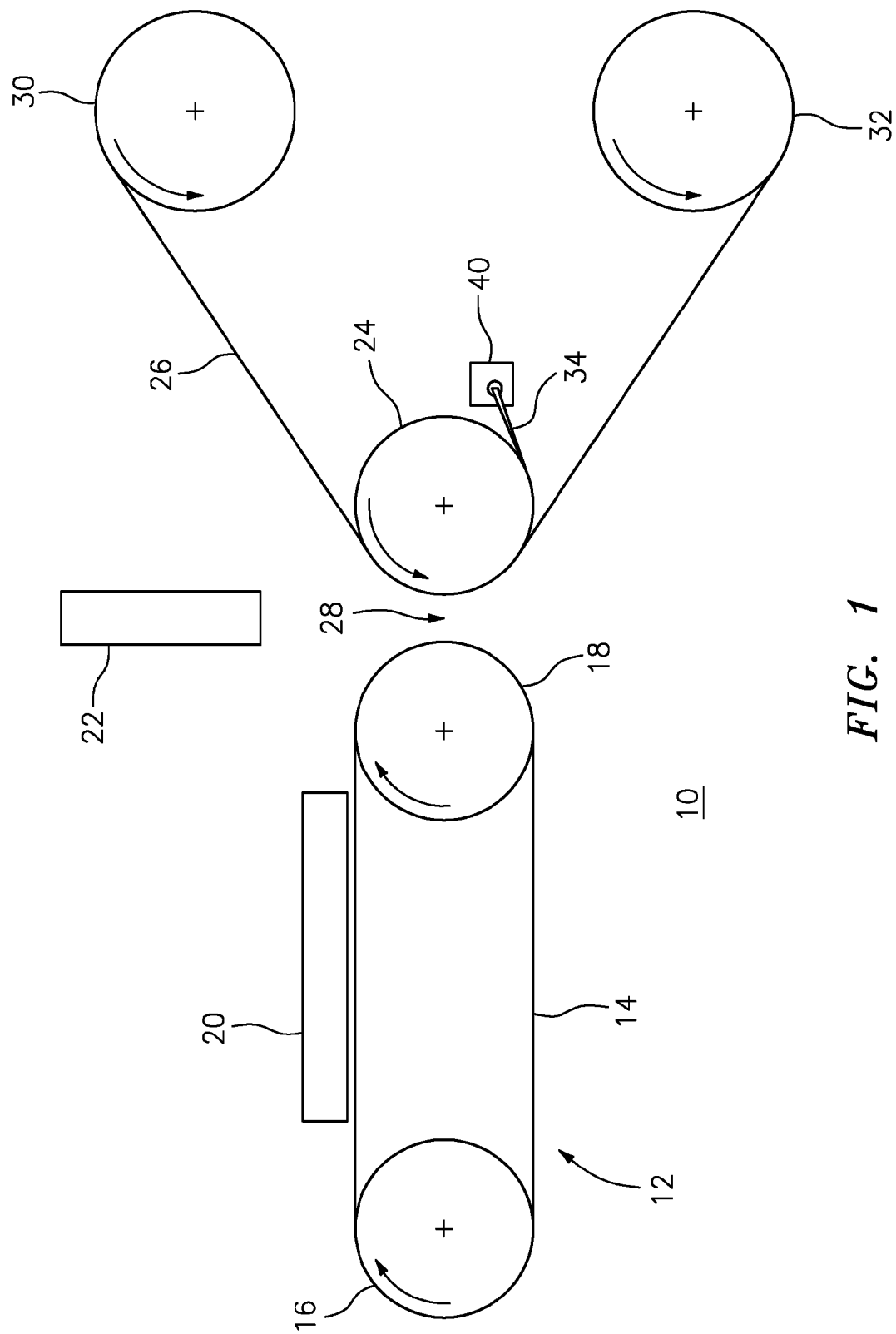
FIG. 1 depicts an apparatus for thermally processing a relief image printing element in accordance with one embodiment of the present invention.
Figure 4:
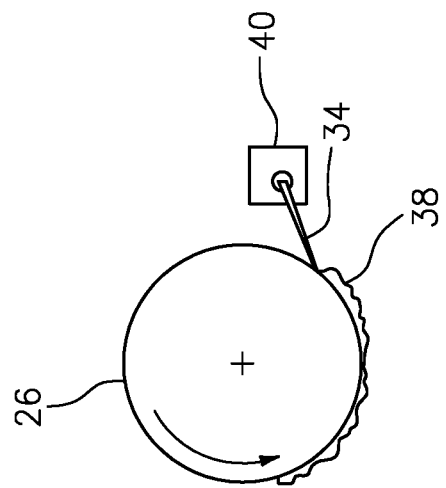
FIG. 4 depicts additional features of the apparatus described in FIG. 2.

In one embodiment, the present invention relates generally to an apparatus for thermally processing a relief image printing element, wherein the relief image printing element comprises at least one photopolymer layer, and wherein the relief image printing element is selectively exposed to actinic radiation to crosslink portions of the at least one photopolymer layer, while portions of the at least one photopolymer layer are not exposed to actinic radiation, and are not crosslinked, the apparatus comprising:

a) means for supporting the relief image printing element;

b) heating means for melting or softening non-crosslinked portions of the at least one photopolymer layer;

c) at least one rotatable roll that is capable of bringing a blotting material into contact with the at least one photopolymer layer to remove the melted or softened non-crosslinked portions of the at least one photopolymer layer, wherein a nip is formed between the means for supporting the relief image printing element and the at least one rotatable roll, wherein as the at least one rotatable roll rotates against the relief image printing element, melted or softened non-crosslinked portions of the at least one photopolymer layer are transferred from the printing element to the blotting material;

d) a scraping means, doctor blade arranged adjacent to the at least one rotatable roll, for removing non-crosslinked photopolymer remaining on a surface of the at least one rotatable roll after step c).

As described herein, a scraping means is used to remove photopolymer residue from the rotatable roll of a thermal processing device. The scraping means is situated at a point after the used blotting material detaches from the at least one rotatable roll, but before the point where the clean nonwoven blotter initially contacts the at least one rotatable roll. The scraping means is positioned preferably in such a way as to cause any debris scraped from the at least one rotatable roll to fall onto the used blotting material and be wrapped up in the used blotting material for disposal. The scraping means can be a doctor blade or a block shaped to fix against the surface of the at least one rotatable roll. Preferably, the scraping means is a doctor blade.

The use of the scraping means improves the function of the thermal processing device by preventing buildup of photopolymer material on the at least one rotatable roll which can cause the blotting material to stick to the at least one rotatable roll or, in extreme cases, to impart an uneven surface to the processed plates.

One advantage of the use of a scraping means is that the scraping means functions continuously during operation of the thermal processor, thereby reducing the amount of time that that the photopolymer residue remains on the hot surface of the at least one rotatable roll. This reduces the tendency of the photopolymer residue to degrade and become intractable to cleaning. In addition, the doctor blade is a passive device and thus does not require any operational changes to function.

The thermal processor 10 of the invention comprising a means for supporting the relief image printing element 20. As depicted in FIG. 1, one means for supporting the relief image printing element 20 comprises a conveyor 12 comprising a continuous loop 14 arranged around a plurality of rolls 16 and 18. Optionally, one or more additional rollers (not shown) may be used to provide additional support to the conveyor 12 to prevent the continuous loop 14 from sagging from the weight of the relief image printing element 20. In one embodiment, the continuous loop 14 comprises wire mesh. The relief image printing element 20 may be held on the conveyor 12 by various means, including a clamp, vacuum or friction. In an alternate embodiment, the relief image printing element may be in the form of a continuous in-the-round (CITR) photopolymer sleeve and the means for supporting the CITR photopolymer sleeve comprising a printing cylinder. Other means for supporting the relief image printing element 20 would also be known to those skilled in the art.

The heating means for melting or softening non-crosslinked photopolymer may comprise a supplemental heater 22 arranged in a preheating zone prior to and/or adjacent to the at least one rotatable roll 24 to improve the efficiency of the softening/melting of the non-crosslinked photopolymer and to further soften and liquefy portions of the at least one layer of photopolymer material. Although various types of heaters may be used, preferably the supplemental heater is an infrared heater.

In addition, the at least one rotatable roll 24 is preferably heated to and maintained at a temperature of between about 120 and about 200° C. while the relief image printing element 20 is in contact with the at least one rotatable roll through the blotting material. This allows the at least one rotatable roll 24 to melt and/or soften the non-crosslinked photopolymer and allows for the melted or softened photopolymer to be removed from the surface of the relief image printing element 20.

The at least one rotatable roll 24 is capable of bringing a blotting material 26 into contact with the at least one photopolymer layer of the relief image printing element 20 to remove the melted or softened non-crosslinked portions of the at least one photopolymer layer, wherein a nip 28 is formed between the means for supporting the relief image printing element 20 and the at least one rotatable roll 24, wherein as the at least one rotatable roll 24 rotates against the relief image printing element 20, melted or softened non-crosslinked portions of the at least one photopolymer layer are transferred from the printing element 20 to the blotting material 26.

The blotting material 26 is supplied to the at least one rotatable roll 24 from a supply roll 30 of the blotting material 26, wherein the blotting material 26 is fed from the supply roll 30 and around an outer surface of the at least one rotatable roll 24, wherein the blotting material 26 initially contacts the at least one rotatable roll 24 at a point prior to the nip 28 and separates from the at least one rotatable roll 24 at a point after the nip 28. The blotting material 26 is looped under and around at least the portion of the at least one rotatable roll 24 that contacts the imaged surface of the relief image printing element 20. Fresh blotting material 26 is continuously supplied to the surface of the at least one rotatable roll 24 from the supply roll 30 of the web of blotting material 26.

The apparatus described herein also comprises a take-up roll 32, wherein the blotting material 26 containing melted or softened non-crosslinked portions of the at least one photopolymer layer is rewound for disposal. The take-up roll 32 may be independently belt driven by a motor (not shown), such as a variable speed motor. The take-up roll 32 collects the web of blotting material 26 after it has contacted the relief image printing element 20 and removed portions of the photopolymer layer that were liquefied or softened. An auto-slicing device (not shown), may be used to change over the supply roll 30 of blotting material 26 to a fresh roll of blotting material 26.

The apparatus described herein also comprises an element (scraping means) arranged adjacent to the at least one rotatable roll 24 for removing non-crosslinked photopolymer remaining on a surface of the at least one rotatable roll 24 after the blotting step has been performed. In a preferred embodiment, the element comprises a doctor blade 34. The doctor blade 34 scrapes non-crosslinked photopolymer from the surface of the at least one rotatable roll 24. This feature can best be seen in FIG. 2.

Figure 2:
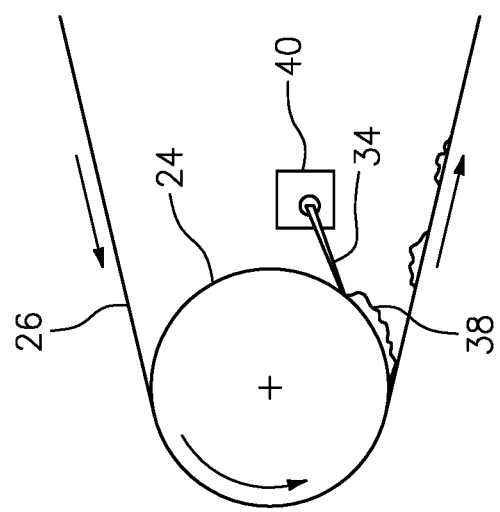
FIG. 2 depicts additional features of the apparatus described in FIG. 1.

As depicted in FIG. 2, non-crosslinked photopolymer 38 remaining on the surface of the at least one rotatable roll 24 can be removed by the doctor blade 34. The doctor blade 34 is situated to deposit the non-crosslinked photopolymer 38 onto the blotting material 26 at a point after which the blotting material 26 has been separated from the at least one rotatable roll 24 and is being rewound onto the take-up roll 32.

The doctor blade 34 is arranged at a point after the blotting material 26 separates from the at least one rotatable roll 24 and before a point where the blotting material 26 initially contacts the at least one rotatable roll 24.

In a preferred embodiment, the doctor blade 34 comprises a flexible material which may be a polyurethane resin, metal sheet, or a rigid plate covered with a non-stick coating such as polytetrafluoroethylene (i.e., Teflon®). Other materials for the doctor blade 34 would also be known to those skilled in the art.

The doctor blade 34 is coupled to a blade holder 40 so that the doctor blade 34 can be adjusted and/or replaced as needed. The blade holder 40 supports the doctor blade 34 so as to position a leading edge of the doctor blade 34 to contact the surface of the at least one rotatable roll 24, thus enabling the doctor blade 34 to scrape the non-crosslinked photopolymer 38 on the surface of the at least one rotatable roll 24 off the at least one rotatable roll 24 and onto the blotting material 26 for disposal.

As depicted in the figures, it is generally desirable that the doctor blade 34 be arranged at an angle relative to the at least one rotatable roll 24 in order to facilitate removal of the non-crosslinked photopolymer 38. While the angle is not critical to the invention, in one embodiment, the doctor blade 34 is arranged at an angle of less than about 90° relative to the at least one rotatable roll 24.

Finally, the blotting material 26 is typically selected from the group consisting of screen mesh, woven fabric, non-woven fabric, and paper. Either woven or non-woven fabric is used and the fabric can be polymer based or paper, so long as the fabric can withstand the operating temperatures involved. The selection of the blotting material depends in part upon the thickness of the photosensitive printing element to be processed, the melting temperature of the blotting material, and the heat transfer characteristics of both the photosensitive printing element and the blotting material. In one embodiment, the blotting material 26 is a non-woven blotting material, such as a non-woven fabric.

The apparatus described herein also preferably comprises a means for maintaining contact between the at least one roll 24 and the relief image printing element 20. The means for maintaining contact may comprise an air cylinder or a hydraulic cylinder that acts to force the at least one roll 24 against the imaged surface of the relief image printing element 20. Other means for maintaining contact between the at least one roll 24 and the relief image printing element 20 would also be known to those skilled in the art.

The present invention also relates generally to a method of thermally processing a relief image printing element using the apparatus described herein. As described above, the relief image printing element comprises a backing layer and at least one photopolymer layer disposed on the backing layer, wherein the relief image printing element is selectively exposed to actinic radiation to crosslink portions of the at least one photopolymer layer, wherein portions of the at least one photopolymer layer are not exposed to actinic radiation and are not crosslinked. The method generally comprises the steps of:

a) melting or softening non-crosslinked portions of the at least one photopolymer layer;

b) causing contact between the surface of the relief image printing element and a blotting material arranged on a portion of the at least one rotatable roll, wherein when the at least one rotatable roll rotates, the blotting material contacts at least a portion of a surface of the at least one photopolymer layer and melted or softened non-crosslinked portions of the at least one photopolymer layer are transferred to the blotting material; and c) scraping the at least one rotatable roll to remove non-crosslinked photopolymer remaining on the at least one rotatable roll after step b).

As described herein the step of scraping the at least one rotatable roll to remove non-crosslinked photopolymer comprises arranging a doctor blade 34 adjacent to a surface of the at least one rotatable roll 24, wherein a leading edge of the doctor blade 34 contacts the surface of the at least one rotatable roll 24 and scrapes non-crosslinked photopolymer 38 from the surface of the at least one rotatable roll 24 and onto the blotting material 26.

In another embodiment, the present invention also relates generally to an apparatus for thermally processing a relief image printing element, wherein the relief image printing element comprises at least one photopolymer layer, and wherein the relief image printing element is selectively exposed to actinic radiation to crosslink portions of the at least one photopolymer layer, while portions of the at least one photopolymer layer are not exposed to actinic radiation and are not crosslinked, the apparatus comprising:

a) means for supporting the relief image printing element;

b) heating means for melting or softening non-crosslinked portions of the at least one photopolymer layer;

c) at least one rotatable roll arranged adjacent to the means for support the relief image printing element to remove melted or softened non-crosslinked portions of the at least one photopolymer layer, wherein a nip is formed between the means for supporting the relief image printing element and the at least one rotatable roll, wherein as the at least one rotatable roll rotates against the relief image printing element, melted or softened non-crosslinked portions of the at least one photopolymer layer are transferred from the relief image printing element to a surface of the at least one rotatable roll;

d) a scraping means, arranged adjacent to the at least one rotatable roll at a point after the nip, for scraping the transferred melted or softened non-crosslinked portions of the at least one photopolymer layer from the surface of the at least one rotatable roll; and e) a waste container arranged to contain the non-crosslinked photopolymer scraped from the surface of the at least one rotatable roll.

Figure 3:
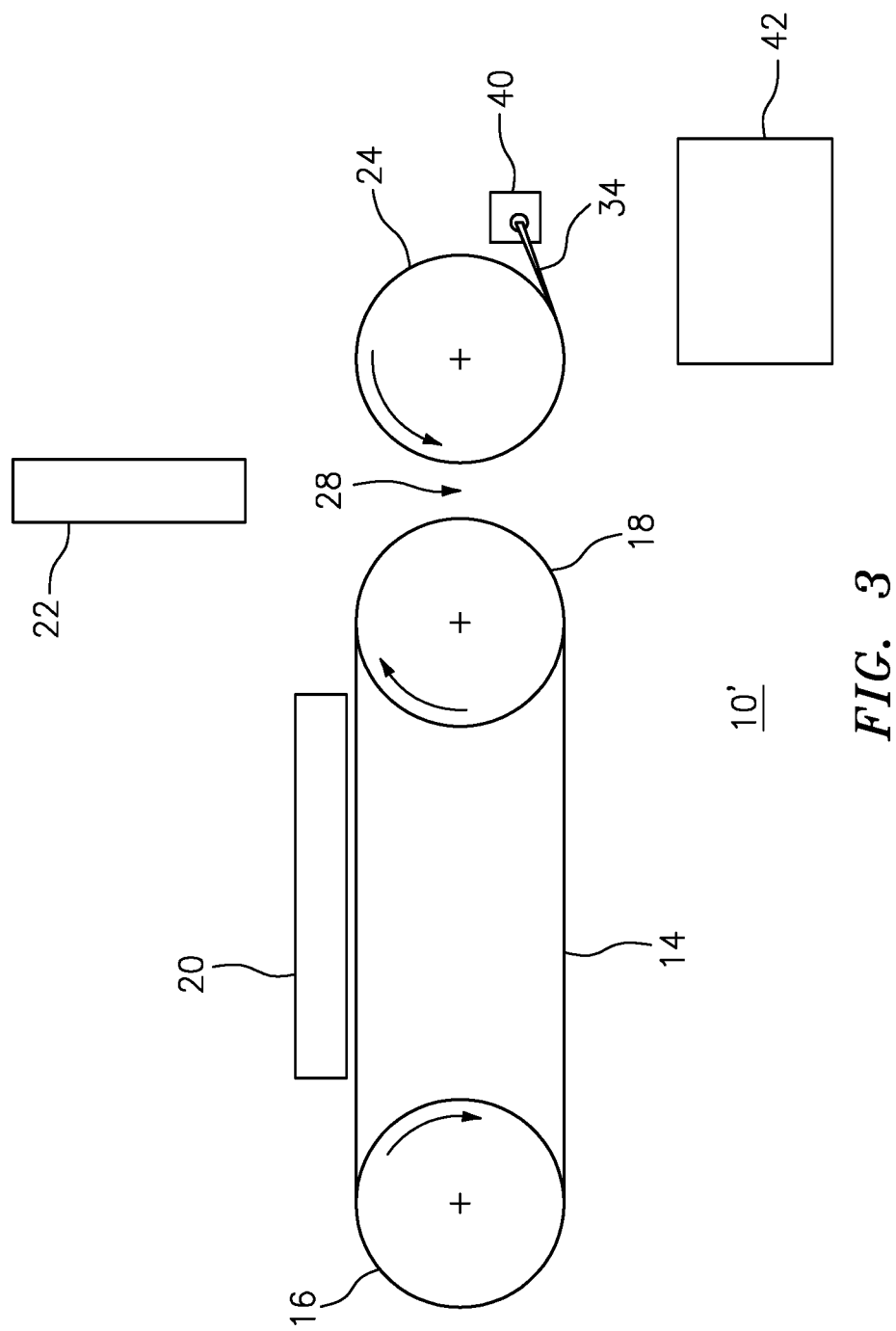
FIG. 3 depicts an apparatus for thermally processing a relief image printing element in accordance with another embodiment of the present invention.

As seen in FIG. 3, the rotatable roll 24 itself removes the melted or softened non-crosslinked photopolymer instead of the melted or softened non-crosslinked photopolymer being transferred to a blotting material. Thus, the melted or softened non-crosslinked photopolymer 38 is transferred from the relief image printing element 20 to the at least one rotatable roll 24 in a thermal nip 28. The doctor blade 34 (the preferred scraping means) is arranged adjacent to the at least one rotatable roll 24 at a point after the nip 28 to scrape the non-crosslinked photopolymer 38 from the surface of the at least one rotatable roll 24 and into a waste container 42. The advantage of this embodiment of the invention is that this "blotterless" system reduces the waste produced by the thermal processing system by an order of magnitude or more.

As described herein, the thermal nip 28 is used to transfer non-crosslinked photopolymer from the imaged relief image printing element to the surface of at least one rotatable roll which is preferably heated to a temperature of between about 120 and about 200° C. Thereafter, a doctor blade 34 is used to remove photopolymer residue from the hot roll of the thermal processing device. The blade is situated at a point after the thermal nip. In addition the doctor blade 34 is positioned in such a way to cause any debris scraped from the at least one roll 24 to fall into a waste container 42 for disposal.

The use of the doctor blade 34 in this manner improves the function of the thermal processing device; while at the same time drastically reduces the complexity of the thermal processing device.

The present invention also relates generally to a method of thermally processing a relief image printing element using the apparatus described herein. As described above, the relief image printing element comprises a backing layer and at least one photopolymer layer disposed on the backing layer, wherein the relief image printing element is selectively exposed to actinic radiation to crosslink portions of the at least one photopolymer layer, and wherein portions of the at least one photopolymer layer not exposed to actinic radiation are not crosslinked. The method generally comprises the steps of:

a) melting or softening non-crosslinked portions of the at least one photopolymer layer;

b) causing contact between the surface of the relief image printing element and at least one rotatable roll, wherein a nip is formed between the means for supporting the relief image printing element and the at least one rotatable roll, wherein as the at least one rotatable roll rotates against the relief image printing element, melted or softened non-crosslinked portions of the at least one photopolymer layer are transferred from the relief image printing element to a surface of the at least one rotatable roll; and c) scraping the at least one rotatable roll to remove non-crosslinked photopolymer remaining on the at least one roll after step b).

Thus, it can be seen that the present invention provides an improved apparatus for thermally processing relief image printing element providing improved cleaning of the hot roll and eliminating the need for a blotting material for removal of non-crosslinked photopolymer.

What is claimed is:

1. An apparatus for thermally processing a relief image printing element, wherein the relief image printing element comprises at least one photopolymer layer, and wherein the relief image printing element is selectively exposed to actinic radiation to crosslink portions of the at least one photopolymer layer, while portions of the at least one photopolymer layer are not exposed to actinic radiation and are not crosslinked, the apparatus comprising:

a) means for supporting the relief image printing element;
b) heating means for melting or softening non-crosslinked portions of the at least one photopolymer layer;
c) at least one rotatable roll that is capable of bringing a blotting material into contact with the at least one photopolymer layer to remove the melted or softened non-crosslinked portions of the at least one photopolymer layer, wherein a nip is formed between the means for supporting the relief image printing element and the at least one rotatable roll, wherein as the at least one rotatable roll rotates against the printing element, melted or softened non-crosslinked portions of the at least one photopolymer layer are transferred from the printing element to the blotting material;
d) a scraping means arranged adjacent to the at least one rotatable roll, for removing non-crosslinked photopolymer remaining on a surface of the at least one rotatable roll after step a).

2. The apparatus according to claim 1, wherein the blotting material is supplied to the at least one rotatable roll from a supply roll of the blotting material, wherein the blotting material is fed from the supply roll and around an outer surface of the at least one rotatable roll, wherein the blotting material initially contacts the at least one rotatable roll at a point prior to the nip and separates from the at least one rotatable roll at a point after the nip.

3. The apparatus according to claim 2, further comprising a take-up roll, wherein the blotting material containing melted or softened non-crosslinked portions of the at least one photopolymer layer is rewound for disposal.

4. The apparatus according to claim 3, wherein the scraping means is arranged at a point after the blotting material separates from the at least one rotatable roll and before a point where the blotting material initially contacts the at least one rotatable roll.

5. The apparatus according to claim 1, wherein the heating means for melting or softening non-crosslinked portions of the at least one photopolymer layer comprises a supplemental heater arranged adjacent to the at least one rotatable roll.

6. The apparatus according to claim 1, wherein the at least one rotatable roll is maintained at a temperature of between about 120 and about 200° C.

7. The apparatus according to claim 1, wherein the scraping means comprises a doctor blade.

8. The apparatus according to claim 7, wherein the doctor blade is removably coupled to a blade holder, and wherein the blade holder supports the doctor blade to position a leading edge of the doctor blade to contact the surface of the at least one rotatable roll.

9. The apparatus according to claim 7, wherein the doctor blade is arranged at an angle of less than about 90° relative to the at least one rotatable roll.

10. The apparatus according to claim 1, wherein the blotting material is selected from the group consisting of screen mesh, woven fabric, non-woven fabric, and paper.

11. An apparatus for thermally processing a relief image printing element, wherein the relief image printing element comprises at least one photopolymer layer, and wherein the relief image printing element is selectively exposed to actinic radiation to crosslink portions of the at least one photopolymer layer, while portions of the at least one photopolymer layer are not exposed to actinic radiation and are not crosslinked, the apparatus comprising:
a) means for supporting the relief image printing element;
b) heating means for melting or softening non-crosslinked portions of the at least one photopolymer layer;
c) at least one rotatable roll arranged adjacent to the means for support the relief image printing element to remove melted or softened non-crosslinked portions of the at least one photopolymer layer, wherein a nip is formed between the means for supporting the relief image printing element and the at least one rotatable roll, wherein as the at least one rotatable roll rotates against the relief image printing element, melted or softened non-crosslinked portions of the at least one photopolymer layer are transferred from the relief image printing element to a surface of the at least one rotatable roll;
d) a scraping means, arranged adjacent to the at least one rotatable roll at a point after the nip, for scraping the transferred melted or softened non-crosslinked portions of the at least one photopolymer layer from the surface of the at least one rotatable roll; and
e) a waste container arranged to contain the non-crosslinked photopolymer scraped from the surface of the at least one rotatable roll.

12. The apparatus according to claim 11, wherein the at least one rotatable roll is maintained at a temperature of between about 120 and about 200° C.

13. The apparatus according to claim 11, further comprising a supplemental heater arranged adjacent to the conveyor and the hot roll to further soften non-crosslinked portions of the at least one photopolymer layer.

14. The apparatus according to claim 11, wherein the scraping means comprises a doctor blade.

15. The apparatus according to claim 14, wherein the doctor blade is removably coupled to a blade holder, and wherein the blade holder supports the doctor blade to position a leading edge of the doctor blade to contact the surface of the at least one rotatable roll.

16. The apparatus according to claim 14, wherein the doctor blade is arranged at an angle of less than about 90° relative to the at least one roll.

* * * * *